(12) United States Patent
Chang et al.

(10) Patent No.: US 7,801,717 B2
(45) Date of Patent: Sep. 21, 2010

(54) METHOD FOR SMART DUMMY INSERTION TO REDUCE RUN TIME AND DUMMY COUNT

(75) Inventors: Gwan Sin Chang, Hsinchu (TW); Yi-Kan Cheng, Taipei (TW); Cliff Hou, Taipei (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 734 days.

(21) Appl. No.: 11/625,658

(22) Filed: Jan. 22, 2007

(65) Prior Publication Data

US 2008/0176343 A1    Jul. 24, 2008

(51) Int. Cl.
  *G06F 17/50*    (2006.01)
(52) U.S. Cl. ........................................ 703/14; 438/692
(58) Field of Classification Search .................. 703/13, 703/14; 700/109; 716/7, 2, 19, 4, 10; 257/202; 438/692, 14; 356/630
See application file for complete search history.

(56) References Cited

U.S. PATENT DOCUMENTS

| | | | | |
|---|---|---|---|---|
| 6,484,300 | B1* | 11/2002 | Kim et al. | 716/7 |
| 7,197,737 | B1* | 3/2007 | Iandolo et al. | 716/10 |
| 2003/0229410 | A1* | 12/2003 | Smith et al. | 700/109 |
| 2003/0229881 | A1* | 12/2003 | White et al. | 716/19 |
| 2004/0070773 | A1* | 4/2004 | Hirose et al. | 356/630 |
| 2005/0196964 | A1* | 9/2005 | Smith et al. | 438/692 |
| 2005/0205961 | A1 | 9/2005 | Doong | |
| 2007/0156379 | A1* | 7/2007 | Kulkarni et al. | 703/14 |
| 2007/0196994 | A1 | 8/2007 | Lee et al. | |
| 2007/0264731 | A1* | 11/2007 | Jeng | 438/14 |
| 2007/0266352 | A1* | 11/2007 | Cheng et al. | 716/4 |
| 2007/0288219 | A1* | 12/2007 | Zafar et al. | 703/14 |
| 2008/0005704 | A1* | 1/2008 | Miloslavsky et al. | 716/2 |
| 2008/0121939 | A1* | 5/2008 | Murray et al. | 257/202 |

FOREIGN PATENT DOCUMENTS

KR    10-0660916 B1    12/2006

OTHER PUBLICATIONS

GTsmooth, Hybrid Metal-Fill Tool, 6 pages, 2006, iMediasoft, www.xyalis.com/gtsmooth.htm
Chinese Patent Office, Office Action of Aug. 7, 2009, Application No. 200710103909X, 5 pages.

* cited by examiner

*Primary Examiner*—Paul L Rodriguez
*Assistant Examiner*—Kandasamy Thangavelu
(74) *Attorney, Agent, or Firm*—Haynes and Boone, LLP

(57) ABSTRACT

A method involves providing a circuit pattern, generating a density report for the circuit pattern that identifies a feasible area for dummy insertion, simulating a planarization process with the density report and identifying a hot spot on the circuit pattern, inserting a virtual dummy pattern in the feasible area and adjusting the density report accordingly, and thereafter simulating the planarization process with the adjusted density until the hot spot is eliminated.

23 Claims, 6 Drawing Sheets

METHOD FOR SMART DUMMY INSERTION TO REDUCE RUN TIME AND DUMMY COUNT

BACKGROUND

The present disclosure relates generally to semiconductor processing, and more particularly to a method for smart dummy insertion that optimizes the number of dummy insertions while preserving a chemical mechanical polishing (CMP) quality.

A dual damascene process is generally adopted in semiconductor fabrication when feature size is scaled down and technology moves to submicron. In the dual damascene process, copper is generally used as conductive material for interconnection. Other conductive materials include tungsten, titanium, titanium nitride. Accordingly, silicon oxide, fluorinated silica glass, or low dielectric constant (k) materials are used for inter-level dielectric (ILD). A chemical mechanical polishing (CMP) technique is used to etch back and globally planarize the conductive material and/or ILD at a wafer surface. CMP involves both mechanical grinding and chemical etching in the material removal process.

However, because the removal rate of metal and dielectric materials are usually different, polishing selectivity leads to undesirable dishing and erosion effects. Dishing often occurs when the metal recedes below or protrudes above the level of the adjacent dielectric. Erosion is a localized thinning of the dielectric. Dishing and erosion are sensitive to pattern structure and pattern density. Therefore, dummy metal features are designed and incorporated into the damascene structure to make pattern density more uniform and to improve the planarization process.

Other processes using CMP also suffer from similar problems. For example, shallow trench isolation (STI) uses CMP to form a global planarized profile. Over-etching is typically performed to ensure a complete etch of the silicon oxide on silicon nitride. Surface variations associated with local pattern and pattern density may be eliminated by the use of dummy features such as dummy active features in STI trench.

Generally, dummy insertion methods are based on local density rules that add dummy features universally across the wafer to achieve a target uniform density. By doing this, excess dummy features may be formed, thereby increasing the time and costs of semiconductor fabrication. As new process technologies emerge and circuit designs become increasingly complex, these problems will be magnified. Furthermore, these unnecessary dummy features may degrade device performance such as increasing parasitic capacitance. What is needed is a simple and cost-effective method for optimizing the number of dummy features while preserving CMP quality.

BRIEF DESCRIPTION OF THE DRAWINGS

Aspects of the present disclosure are best understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

DETAILED DESCRIPTION

Figure 1:
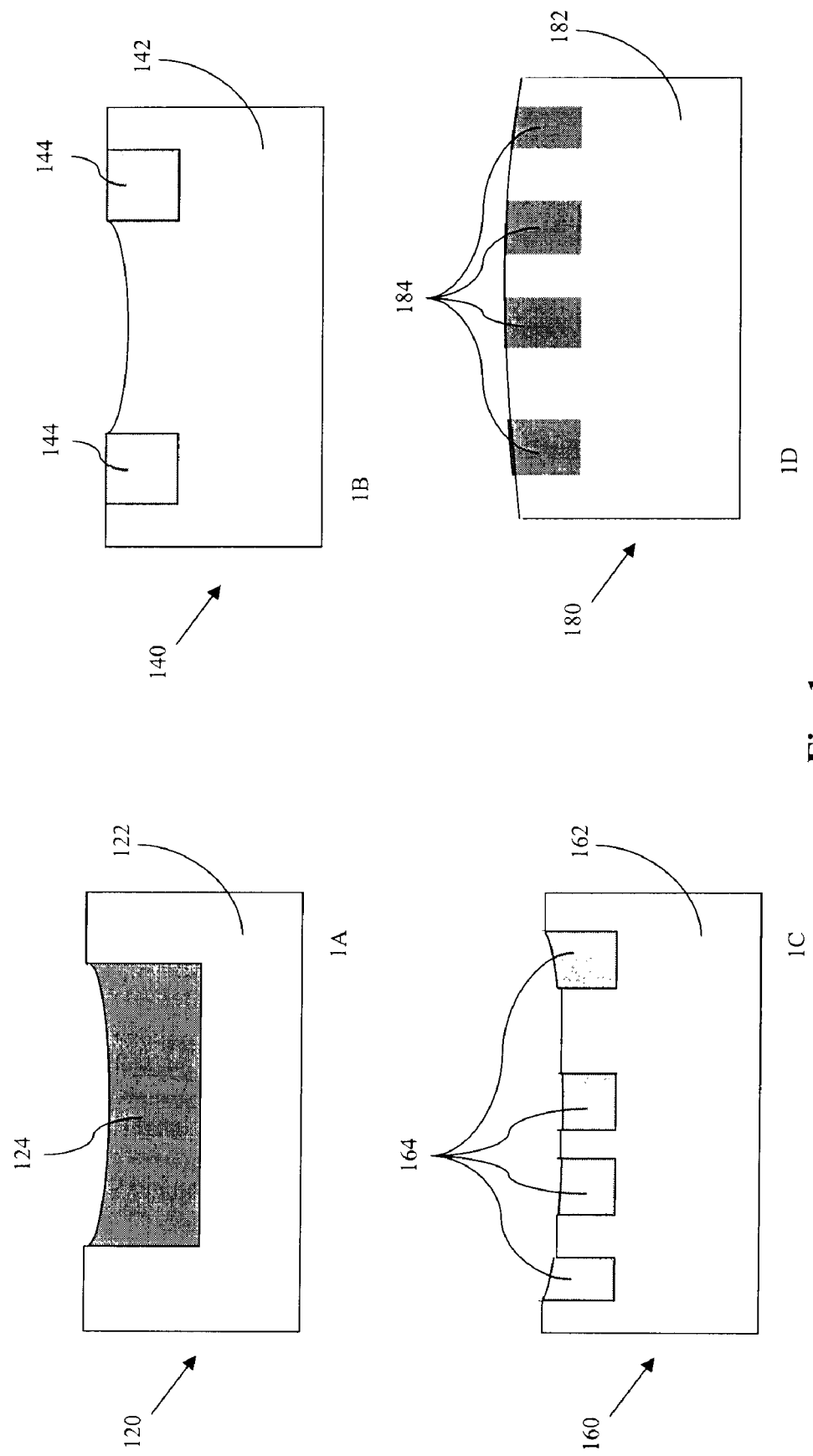
FIGS. 1A-1D are cross-sectional views of dishing and erosion in a semiconductor wafer, caused by chemical mechanical polishing (CMP) processing.

For the purpose of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, which does not by itself indicate a requirement that features of one embodiment apply to another embodiment, even if they share the same reference number.

FIG. 1 is a cross-sectional view 100 of four examples of dishing and erosion effects in a semiconductor wafer caused by chemical mechanical polishing (CMP). In FIG. 1A, a semiconductor device 120 in a semiconductor wafer exhibits dishing when metal 124 has a higher polishing rate than that of dielectric material 122. The dielectric material 122 may include silicon oxide, fluorinated silica glass (FSG), low k materials, or combinations thereof. The metal 124 may include copper, tungsten, titanium, titanium nitride, tantalum, tantalum nitride, or combinations thereof. The dielectric 122 and the metal 124 may be part of interconnection structure in a integrated semiconductor circuit and may be fabricated by dual damascene processing including multiple processes such as deposition, etching, and CMP. When removal rate of the metal feature 124 is higher than that of the dielectric feature 122 in a planarizing process such as CMP, a substantial deviation of surface profile from a flat one is referred to as dishing.

In FIG. 1B, a semiconductor device 140 exhibits dishing when dielectric material 142 has a higher polishing rate than that of metal 144. When the removal rate of the dielectric 142 is higher than that of the metal 144, a substantial deviation of surface profile from a flat one is also referred to as dishing.

In FIG. 1C, a semiconductor device 160 exhibits erosion when a dielectric material 162 has a higher polishing rate than that of metal 164. When the removal rate of the dielectric 162 is higher than that of the metal 164, a substantial deviation of surface profile from a flat one is referred to as erosion.

In FIG. 1D, a semiconductor device 180 exhibits erosion when a dielectric material 182 has a higher polishing rate than that of metal 184. When the removal rate of the metal 184 is higher than that of the dielectric 182, a substantial deviation of surface profile from a flat one is also referred to as erosion.

The semiconductor devices 120, 140, 160, and 180 further include electric circuits and a semiconductor substrate. The electric circuits may include metal oxide semiconductor filed effect transistors (MOSFET), bipolar transistors, diodes, memory cells, resistors, capacitors, inductors, high voltage transistors, sensors, or combinations thereof. The semiconductor substrate may comprise an elementary semiconductor (such as crystal silicon, polycrystalline silicon, amorphous silicon and germanium), a compound semiconductor (such as silicon carbide and gallium arsenic), an alloy semiconductor (such as silicon germanium, gallium arsenide phosphide, aluminum indium arsenide, aluminum gallium arsenide and gallium indium phosphide) and/or combinations thereof. The semiconductor substrate may be a semiconductor on insulator (SOI), having a buried oxide (BOX) structure. In other examples, compound semiconductor substrate may include a multiple silicon structure, or the silicon substrate may include a multilayer compound semiconductor structure.

Dishing and erosion could also result from forming an isolation structure such as shallow trench isolation (STI) by CMP. Such STI, for example, is formed by dry etching a trench in a substrate and filling the trench with insulator materials such as silicon oxide, low k materials, or combinations thereof. Silicon nitride can be used as an etch stop layer to protect active areas between STI regions. The filled trench may have multi-layer structure such as a thermal oxide liner layer plus silicon oxide formed by chemical vapor deposition (CVD). When CMP is used to etch back and planarize the semiconductor surface, polishing selectivity between the silicon oxide and the silicon nitride, may cause dishing.

Both dishing and erosion effects are related to pattern density. To eliminate dishing and erosion in planarization processing including CMP in STI formation and CMP in interconnection formation, dummy insertion can be used to improve pattern density and reduce deviations from a flat profile.

Figure 2:
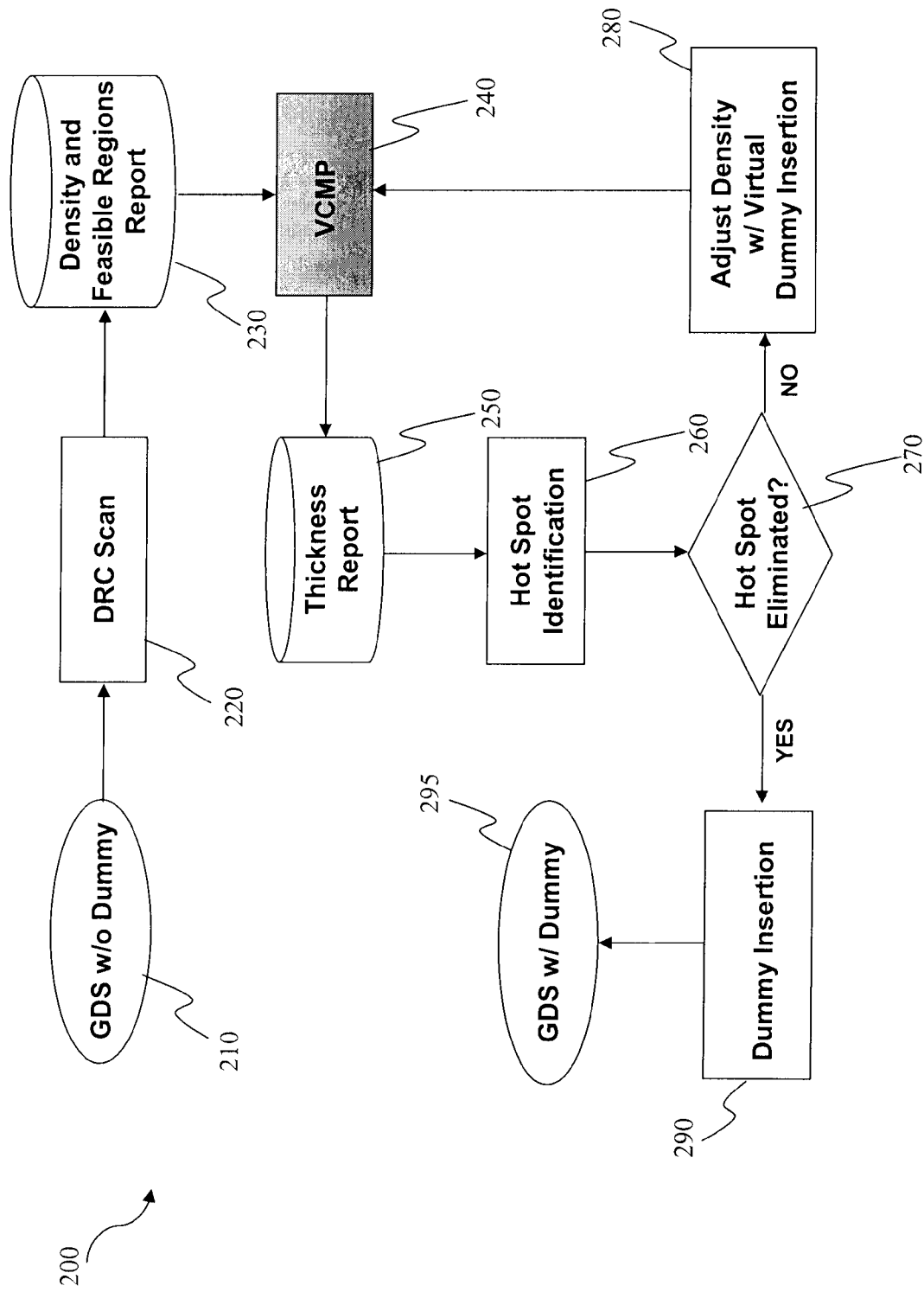
FIG. 2 is a block diagram of an embodiment of a method for smart dummy insertion.

Referring now to FIG. 2, illustrated is a block diagram of a method 200 for smart dummy insertion. The method 200 begins with step 210 in which a circuit layout without dummy insertion is provided based on a customer's integrated circuit design. The circuit layout (e.g., design database) is provided in a computer aided design format such as GDS format. Typically, the circuit layout includes a plurality of metal layers. Each metal layer includes metal interconnects disposed in a dielectric layer. For simplicity and clarity, the method 200 is described using a circuit layout having a single metal layer. However, it is understood that the spirit and the method of the present disclosure can be extended to multiple metal layers because CMP quality may be cumulative. That is, CMP quality of an upper metal layer depends on CMP quality of metal layers lying underneath it. The metal layer of the circuit layout is divided into a plurality of regions (also known as cells, grids, or tiles). It is understood that the number of regions can vary, depending on the technology and the complexity of the circuit design.

The method 200 continues with step 220 in which a design rule check (DRC) performs a density scan on the plurality of regions of the metal layer. The DRC is a software tool that determines whether the circuit layout complies with a set of design rules. For the sake of example, one such rule is a minimum density rule for interconnects in the metal layer. Each region (also known as grids, cells, or tiles) has a local density associated with it. The local density for a given region is the total area of the interconnects located in the region divided by the total area of that region. The minimum density rule requires each region to have a local density equal to or greater than a minimum density value. It is understood that use of the DRC is a mere example and that other types of software applications implemented by various programming languages may be used to determine and extract information about the density and feasible area (as described below) of a particular pattern layout.

The method 200 continues with step 230 in which the DRC provides a density report that includes the local density for each region. Under a typical rule-based method for determining the number and placement of dummies, a dummy fill software tool uses the local density information in the DRC environment to perform dummy insertion across the entire chip. If the local density of a given region does not satisfy a minimum density, the dummy fill software tool inserts dummies in free areas of that region. The CPU runtime and amount of memory (for output file with dummy insertion) that is required depends on the complexity of the circuit design. As new process technologies emerge and circuit designs become increasingly more complex, the runtime and memory required will become costly and impractical. In order to improve this process, a feasible area along with its density is identified before dummy insertion. For example, the DRC is a fast and easy tool to extract this information. The feasible area and its density report represents how much empty area in a given region can still be used for dummy insertion. The feasible area will be dynamically updated as virtual dummies are inserted and a subsequent density report is modified as will be described in more detail below.

The method 200 continues with step 240 in which a virtual chemical mechanical polishing (VCMP) simulator is implemented. The VCMP simulator is a software tool that simulates CMP processing. Each region and its associated local density is provided to the VCMP simulator as an input. Furthermore, other input parameters are provided to the VCMP simulator such as metal material, dielectric material, polishing pad hardness, pad type, polishing slurry formula, polishing pressure, rotation speed, polishing rate, and polishing selectivity.

The method 200 continues with step 250 in which the VCMP simulator generates a thickness and topography report for the metal layer based on the input parameters that were given. The thickness and topography report provides a global thickness profile for the metal layer after a simulated CMP process. The report includes an average thickness for each region of the metal layer.

The method 200 continues with step 260 in which the thickness and topography report is processed to identify hot spots within the metal layer. Hot spots are regions of the metal layer that are highly susceptible to CMP processing problems such as dishing and erosion. For example, one technique to identify a hot spot is to evaluate thickness deviations between neighboring regions of the metal layer. Each region has an average thickness that was determined by the VCMP simulator. For a given region, the thickness deviation between that region and the regions surrounding it is calculated. In the present embodiment, the thickness deviation is the absolute value of the difference between the average thicknesses of that region and the regions next to it. If the thickness deviation is greater than a minimum thickness, then that region is identified as a hot spot. All the regions in the metal layer are evaluated in the same manner to identify all hot spots within the metal layer.

The method 200 continues with step 270 in which a determination of whether the hot spots have been eliminated from the metal layer. If there are hot spots, the method 200 continues with step 280 in which the density report is adjusted to account for virtual dummy insertion. The virtual dummy insertion is a process that recommends a new dummy pattern to fill the feasible area with. The feasible area may be identified in the DRC environment or other suitable software environment as was described above. However, the virtual dummy insertion is conducted outside of the DRC environment. The recommendation is based on the following equation: $Di=Do+(1-Do)*Df*Dp$, where Di is the inserted density for a given region, Do is the original density, Df is the feasible density, and Dp is the effective pattern density for the recommended virtual dummy insertion. The feasible density represents how much empty area in a region is still available for dummy insertion. The feasible density is updated accordingly when a new virtual dummy pattern is added to the feasible area.

The region where the recommended dummy pattern was added will have a higher local density. Accordingly, the density report is adjusted to account for the addition of the recommended virtual dummy pattern. The method 200 repeats steps 240 through 260 to simulate CMP processing with the adjusted density report. The goal is to eliminate all the hot spots and achieve a substantially uniform global thickness profile for the metal layer. Thus, the method 200 will repeat the virtual dummy insertion process (step 280) and simulated CMP process (steps 240 through 260) until most or all hot spots are eliminated from the metal layer. By performing virtual dummy insertion outside of the DRC-based dummy insertion environment and not having to insert dummies universally across the chip, CPU runtime and memory size is greatly improved. Also, this generally benefits other applications of dummy pattern insertion since the insertion count is reduced and optimized.

If there are no hot spots, the method 200 continues with step 290 in which a final recommended dummy pattern including one or more dummies that was determined from the previous steps is incorporated into the circuit layout. In step 295, the circuit layout with the final recommended dummy pattern is provided in a computer aided design format such as GDS format which is now ready for fabrication. Alternatively, the design format may include DEF (design exchange format) or LEF (library exchange format) for the data structure. The method 200 is described with a circuit layout that comprises a single metal layer. However, it is understood that the method 200 can be extended to a circuit layout that comprises multiple metal layers by applying the method to each metal layer. Since CMP quality is cumulative, each metal layer's thickness profile has an affect on the next overlying metal layer's thickness profile. Thus, if all the metal layers have a substantially uniform thickness profile, then the global thickness profile for the entire circuit layout will also be substantially uniform and thereby, eliminate or reduce CMP processing problems such as dishing and erosion.

Figure 3:
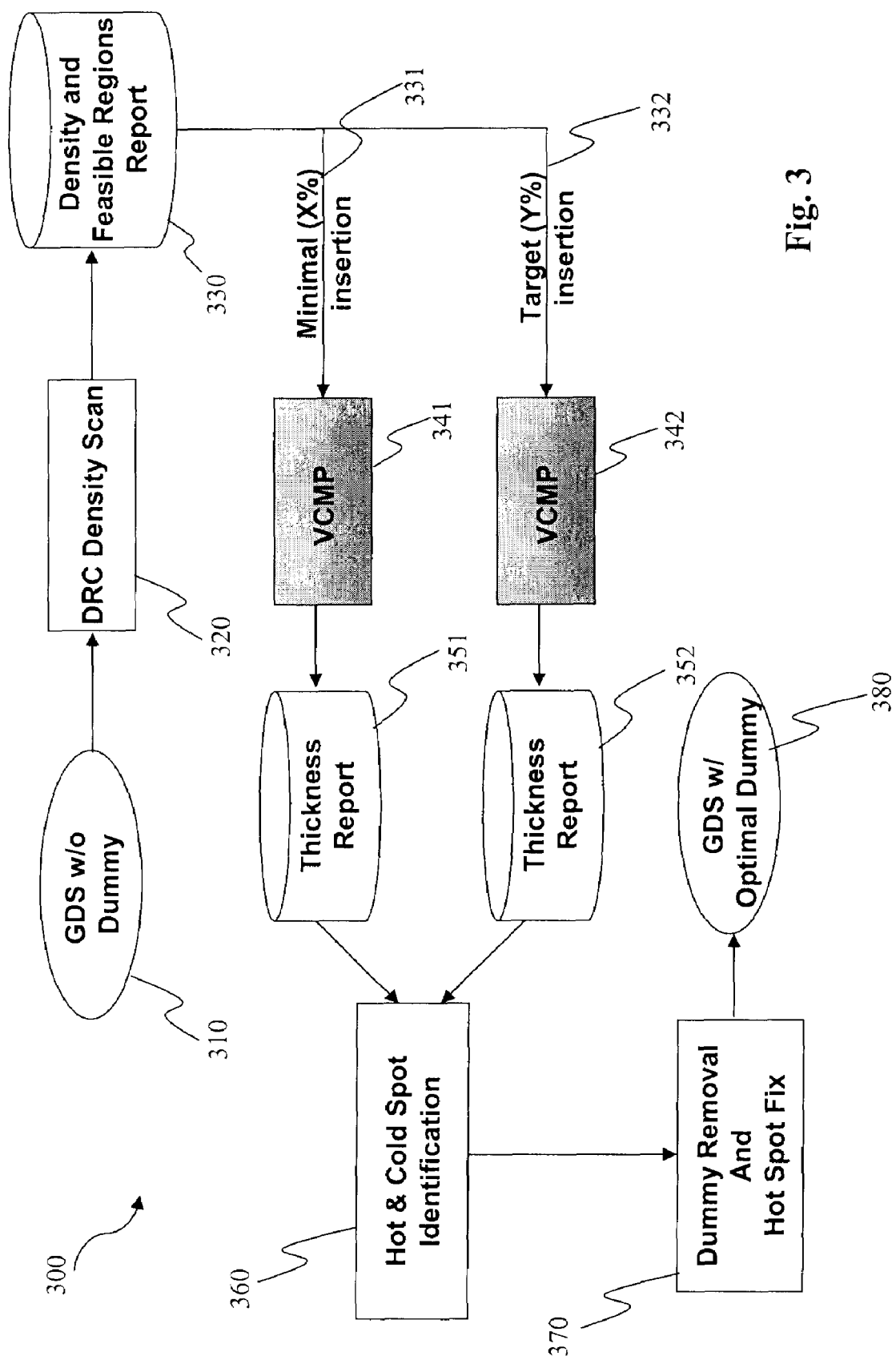
FIG. 3 is a block diagram of another embodiment of a method for smart dummy insertion.

Referring now to FIG. 3, illustrated is a step diagram of another embodiment of a method 300 for smart dummy insertion. The method 300 begins with step 310 in which a circuit layout without any dummy insertion is provided based on a customer's integrated circuit design. The circuit layout is provided in a computer aided design format such as GDS format. Typically, the circuit layout includes a plurality of metal layers. Each metal layer includes metal interconnects disposed in a dielectric layer. For simplicity and clarity, the method 300 is described using a circuit layout having a single metal layer. However, it is understood that the spirit and the method of the present disclosure can be extended to multiple metal layers because CMP quality is accumulative. That is, CMP quality of an upper metal layer may depend on CMP quality of metal layers lying underneath it. The metal layer of the circuit layout is divided into a plurality of regions or cells. It is understood that the number of regions can vary, depending on technology node and complexity of the circuit design.

The method 300 continues with step 320 in which a design rule check (DRC) is conducted on the plurality of regions of the metal layer. The DRC is a software tool that determines whether the metal layer complies with a set of design rules. For the sake of example, one such rule is a minimum density rule for interconnects in the metal layer. Each region or cell has a local density associated with it. The local density for a given region is the total area of the interconnects located in that region divided by the total area of the region. The minimum density rule requires each region to have a local density equal to or greater than a minimum density value.

The method 300 continues with step 330 in which the DRC provides a density report that includes the local density for each region and identifies a feasible area that is available for virtual dummy insertion as previously described above.

The method 300 continues with two simulation runs 331, 332 in which a virtual chemical mechanical polishing (VCMP) simulator is implemented. The VCMP simulator is a software tool that simulates CMP processing. Each region and its associated local density is provided to the VCMP simulator as an input. Furthermore, other input parameters are provided to the VCMP simulator such as metal material, dielectric material, polishing pad hardness, pad type, polishing slurry formula, polishing pressure, rotation speed, polishing rate, and polishing selectivity.

The first VCMP simulation run 331 implements a first density insertion for virtual dummy insertion to the feasible area. For the sake of example, the first density insertion is a minimal density insertion (X %) 341 (e.g., 15% minimum density insertion). The 15% minimal density insertion 341 requires adding virtual dummy patterns to the feasible area to reach 15% density. Accordingly, a first density report is adjusted to account for the addition of these virtual dummy patterns. However, it is understood that the percentage can vary and may depend on a foundry's experience with its CMP process.

The second VCMP simulation run 332 implements a second density insertion for virtual dummy insertion to the feasible area. For the sake of example, the second density insertion is a target density insertion (Y %) 342 (e.g., a 50% target density insertion). The 50% target density insertion 342 requires adding dummy patterns to the feasible area to reach 50% density. Accordingly, a second density report is adjusted to account for the addition of these virtual dummy patterns. However, it is understood that the percentage can vary and may depend on a foundry's experience with its CMP process.

The method continues with steps 351 and 352 in which the VCMP simulator generates a first thickness and topography report from the adjusted first density insertion and a second thickness and topography report from the adjusted second density report. The first thickness and topography report provides a global thickness profile for the metal layer after a simulated CMP process implementing the 15% minimal density insertion 341. The second thickness and topography report provides a global thickness profile for the metal layer after a simulated CMP process implementing the 50% target density insertion 342. Each report includes an average thickness for each region of the metal layer.

The method 300 continues with step 360 in which hot and cold spots are identified by comparing the first thickness report with the second thickness report. Hot spots are regions within the metal layer that are high susceptible to CMP processing problems such as dishing and erosion. For example, one technique to identify a hot spot is to evaluate thickness deviations between neighboring regions of the metal layer. Each region has an average thickness that was determined by the VCMP simulator. For a given region, the thickness deviation between that region and the regions surrounding it is calculated. The thickness deviation is the absolute value of the difference between the average thicknesses of that region and the region next to it. If the thickness deviation is greater than a minimum thickness, then that region is identified as a hot spot. The minimum thickness may be provided by a foundry and its experience with the CMP process. All the regions in the metal layer are evaluated in the same manner to identify all hot spots within the metal layer using both the first and second thickness report. It is understood that the minimum thickness can vary and may be specified by the foundry or other suitable persons.

Alternatively, another technique to identify hot spots is to evaluate thickness deviations between a region from the first thickness report and the same region from the second thickness report. For a given region, the thickness deviation is the absolute value of the difference between the average thickness of a region from the first thickness report and the average thickness of the same region from the second thickness report. If the thickness deviation is greater than a minimum thickness, then that region is identified as a hot spot. All the regions in the metal layer are evaluated in the same manner to identify all hot spots within the metal layer using both the first and second thickness report. It is understood that the minimum thickness can vary and may be specified by the foundry or other suitable persons.

Cold spots are regions of the metal layer that are not susceptible to CMP processing problems and are good candidates for dummy removal. These are regions of the metal layer where a thickness deviation between a region from the first thickness report and the same region from the second thickness report is less than a minimum thickness. As previously discussed in steps 351, 352, the first thickness report was generated by the VCMP simulator implementing 15% minimum density insertion and the second thickness report was generated by the VCMP simulator implementing 50% target density insertion. Accordingly, virtual dummy patterns are added to the feasible area and thus, the insertion count for the 15% target is less than the 50% targeted insertion. By identifying cold spots within the feasible area, the dummy patterns that were added to satisfy the 15% minimum density insertion or the 50% target density insertion can be removed as long as a hot spot (as described above) is not generated by the removal. Alternatively, cold spots may optionally be identified from the same thickness report. It is understood that the minimum thickness and target density insertion can vary and may be specified by the foundry or other suitable persons.

The method 300 continues with step 370 in which dummy patterns are removed in cold spots and dummy patterns are added in hot spots. The dummy patterns are added in hot spots by the same process as described in method 500 (steps 240 through 260 and step 280). Thus, the method 300 provides a dummy insertion process for inserting an optimum amount of dummy patterns that are only necessary to preserve CMP quality and for performing virtual dummy insertion outside the DRC-based insertion environment or other suitable software environment.

The method 300 continues with step 380 in which a new circuit layout with the optimal dummy insertion is provided in a computer aided design format such as GDS format. Alternatively, the design format may include DEF or LEF data structure. The new circuit layout is ready for fabrication.

Figure 4:
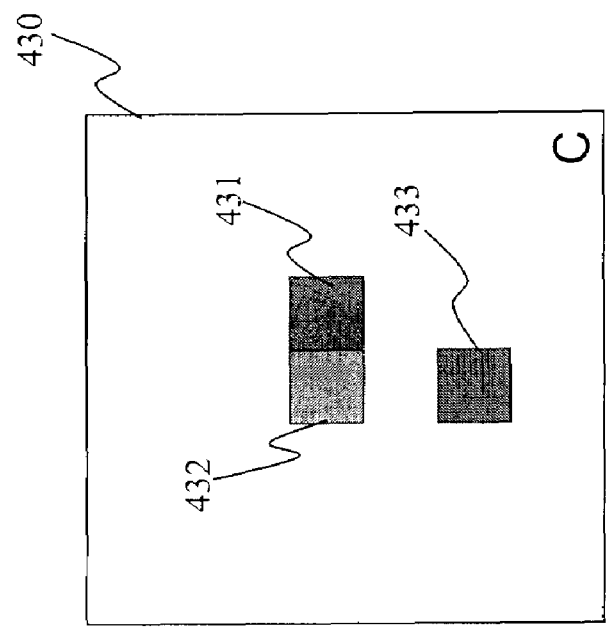
FIG. 4 is a simplified top view of metal layers resulting from implementing the method of FIG. 3.
Figure 4:
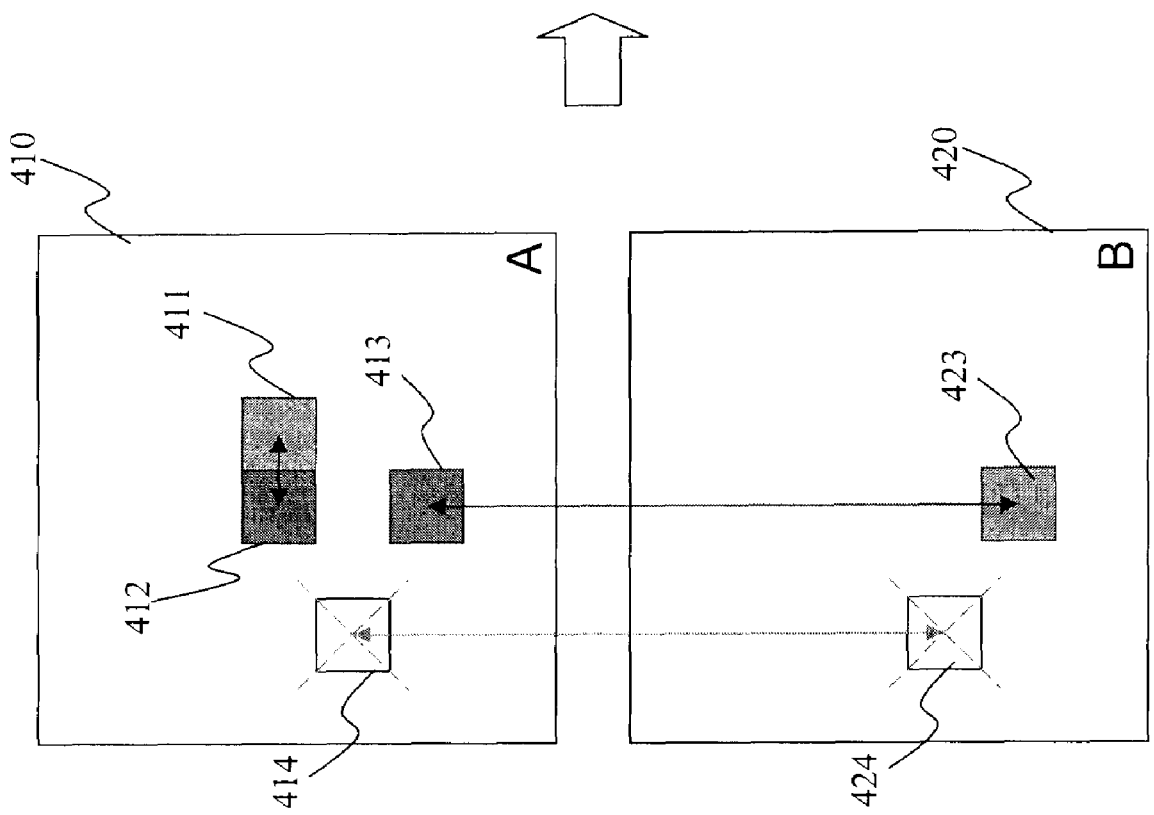

Referring now to FIG. 4, illustrated is a simplified top view a metal layer 410 of the first thickness report (A), a metal layer 420 of the second thickness report (B), and a metal layer 430 (C) resulting from implementing the method 300 of FIG. 3. The metal layer A 410 includes a plurality of regions 411, 412, 413, 414 each having an average thickness as determined by the VCMP. The metal layer (B) 420 includes a plurality of regions 423, 424 each having a thickness as determined by the VCMP.

As previously discussed above, a hot spot is where the thickness deviation between neighboring regions is greater than a minimum thickness. For example, regions 411, 412 of metal layer (A) have a thickness deviation greater than a minimum thickness, thus these regions will be considered virtual dummy insertion. This is shown as regions 431, 432 of metal layer (C), the result of identifying the hot spot from metal layer (A). A hot spots is also where the thickness deviation between the same region of the first report and second report is greater than a minimum thickness. For example, region 413 of metal layer (A) and region 423 of metal layer (B) have a greater thickness deviation than a minimum thickness and thus, this region will be considered for virtual dummy insertion. This is shown as region 433 of metal layer (C), the result of identifying the hot spot from comparing that same region of metal layer (A) and (B).

A cold spot is identified where a thickness deviation between a same region of the first report and second report is less than a minimum thickness. For example, region 414 of metal layer (A) and region 424 of metal layer (B) have a thickness deviation less than a minimum thickness and thus, this region is not considered for virtual dummy insertion. This is shown by the absence of that region in metal layer (C). Accordingly, less regions are considered for dummy insertion thereby reducing the total count of dummy insertion.

Figures 5A, 5B:
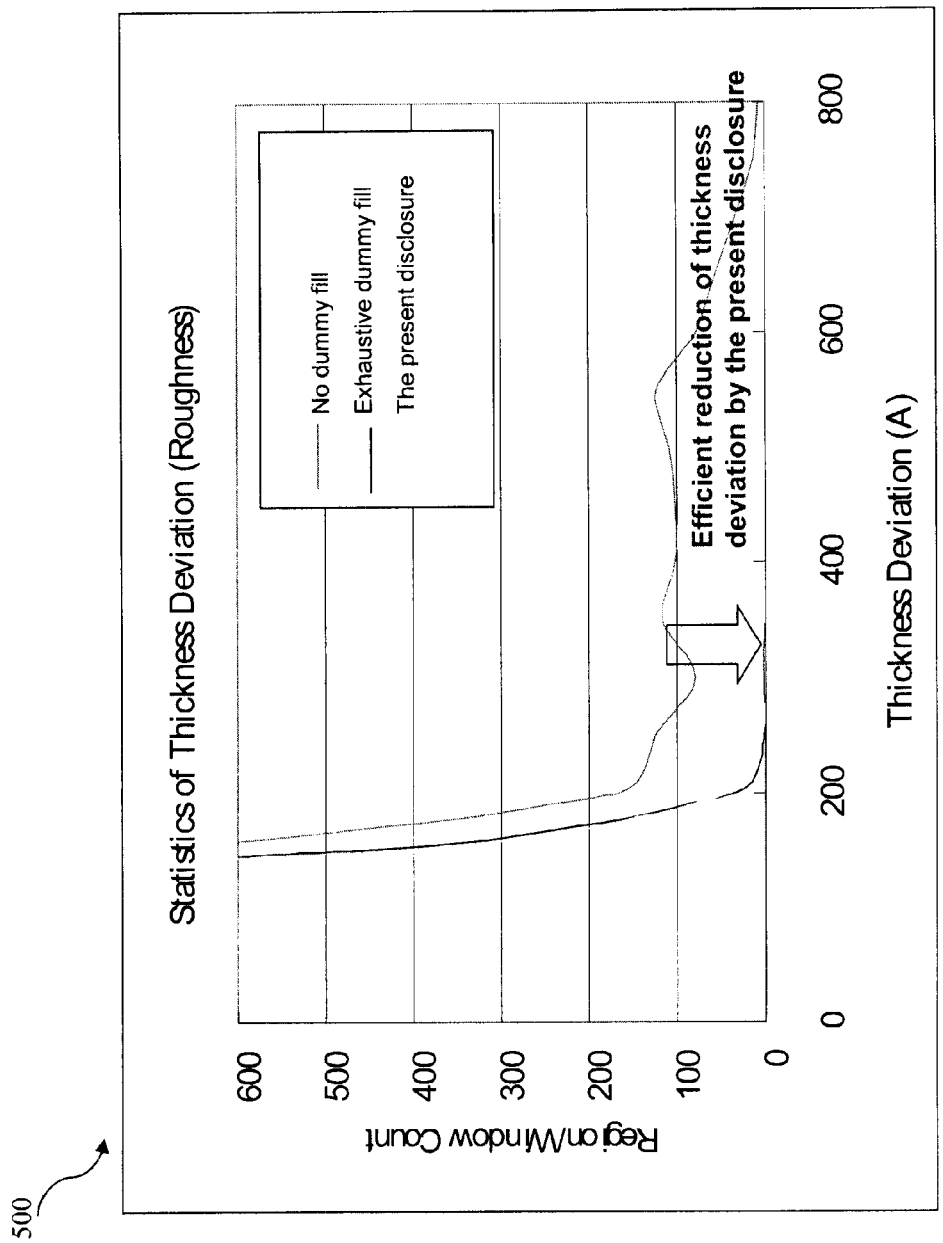
FIG. 5 is a graph illustrating thickness deviations of a metal layer with no dummy insertion, exhaustive dummy insertion, and dummy insertion implementing the method of the present disclosure.

Now referring to FIGS. 5A and 5B, illustrated is a graph 500 of thickness deviations of a metal layer with no dummy insertion, exhaustive dummy insertion, and dummy insertion implementing the method of the present disclosure. As previously discussed, a metal layer is divided into a plurality of regions (also know as grids, cells, or tiles). Three metal layers of the same circuit design are generated. One with no dummy insertion, one with exhaustive dummy insertion (adding dummies universally across the chip), and one with dummy insertion implementing the method of the present disclosure. In FIG. 5B, a thickness deviation for each region (shown as the target window $t_A$) is calculated by taking the absolute value of the difference of that region and the regions surrounding it (shown as surrounding windows $t_B$). This is done for all three metal layers and the result is shown in the graph 500. The horizontal axis represents thickness deviation in Angstroms (A) and the vertical axis represents the region/window count. The graph 500 shows that there is an efficient reduction in thickness deviations when implementing the method of the present disclosure as compared to no dummy insertion. The graph 500 also shows that thickness deviations are very similar when implementing the method of the present disclosure as compared to exhaustive dummy insertion. Thus, the method of the present disclosure optimizes dummy distribution (by improving runtime and memory and reducing total dummy count) without sacrificing CMP quality.

Figure 6:
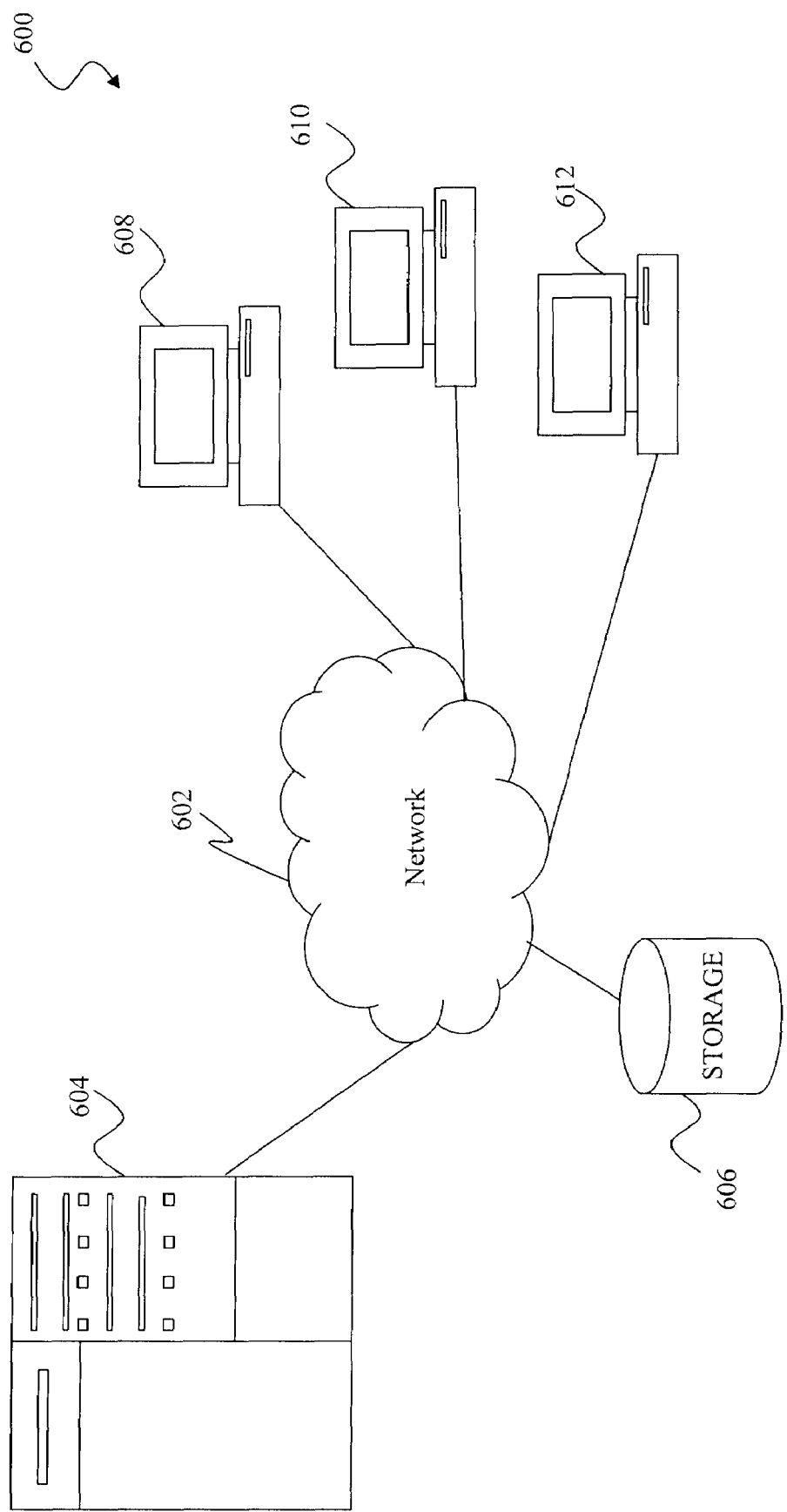
FIG. 6 is a data processing system within which the method of the present disclosure may be implemented.

Referring now to FIG. 6, illustrated is a data processing system 600 within which the method of the present disclosure may be implemented. The processing system 600 includes a network 602, which is the medium used to provide communications links between various devices and computers connected together within the data processing system 600. The network 602 may include connections such as wire, wireless, or fiber optic cables. A server 604 is connected to the network 602 along with a storage unit 606. In addition, clients 608, 610, and 612 are connected to the network 602. These clients 608, 610, and 612 may be, for example, personal computers or network computers. The server 604 provides data, such as boot files, operating system images, and applications to the clients 608-612. The clients 608, 610, and 612 are clients to the server 604. The network data processing system 600 may include additional servers, clients, and other devices not shown.

Additionally, the network 602 may include the Internet and/or a collection of networks and gateways that use such things as a Transmission Control Protocol/Internet Protocol (TCP/IP) suite of protocols to communicate with one another. In another example, the network 602 may include a number of different types of networks, such as a local area network (LAN), or a wide area network (WAN). One or more steps of the method of the present disclosure may be performed by the same computer and/or same program. It is understood that FIG. 6 is intended as an example, and not as an architectural limitation for the present invention.

Thus, the present disclosure provides a method for dummy insertion. The method includes providing a circuit pattern, generating a density report for the circuit pattern that identifies a feasible area for dummy insertion, simulating a planarization process with the density report and identifying a hot spot on the circuit pattern, inserting a virtual dummy pattern in the feasible area and adjusting the density report accordingly, and thereafter simulating the planarization process with the adjusted density until the hot spot is eliminated. In some embodiments, the providing includes providing the circuit pattern in a computer aided design format. In some embodiments, the circuit pattern is in GDS format. In some embodiments, the providing includes configuring the pattern to include a plurality of metal levels.

In other embodiments, the generating includes dividing the circuit layout into a plurality of regions and determining a local density for each region by in a software environment such as a design rule check (DRC) tool. The simulating includes running a virtual chemical mechanical polishing (VCMP) simulator to generate a thickness and topography report for the plurality of regions. The identifying includes identifying the hot spot where a thickness deviation between neighboring regions is greater than a minimum thickness.

The present disclosure also provides a method for optimal dummy insertion. The method includes providing a circuit layout, generating a density report for the circuit layout to identify an area for dummy insertion, simulating a first planarization process that implements a first density insertion for inserting dummy patterns within the area and a second planarization process that implements a second density insertion for inserting dummy patterns within the area, and determining an optimal dummy insertion for the circuit layout by comparing a first thickness report from the first planarization process with a second thickness report from the second planarization process to identify a hot spot and a cold spot. In some embodiments, the generating includes dividing the circuit layout into a plurality of grids, each grid has a local density associated with it. In some embodiments, the generating includes running a design rule check (DRC) on the plurality of grids to identify the area and its density for dummy insertion. In other embodiments, the simulating includes running a virtual chemical mechanical polishing (VCMP) simulator.

In still other embodiments, the simulating includes configuring the first density insertion to include a minimal density insertion. Also, the simulating includes configuring the second density insertion to include a target density insertion. In some embodiments, the determining includes identifying a cold spot for removing dummy patterns within the area, the cold spot is where a thickness deviation between a grid from the first planarization process and that same grid from the second planarization process is less than a minimum thickness. In other embodiments, the determining includes identifying a hot spot for adding dummy patterns within the area, the hot spot is where a thickness deviation between neighboring grids is greater than a minimum thickness. In still other embodiments, the determining includes identifying a hot spot for adding dummy patterns within the area, the hot spot is where a thickness deviation between a grid from the first thickness report and the same grid from the second thickness report is greater than a minimum thickness. In other embodiments, the method further comprises generating a final circuit layout with the optimal dummy insertion.

The present disclosure also provides a semiconductor device comprising a circuit layout having a plurality of regions, wherein each region has a local density associated with it, an area within the circuit layout that is available for dummy insertion, and an optimal dummy insertion formed within the area, wherein the optimal dummy insertion is configured by comparing a first simulated planarization process implementing a first density insertion with a second simulated planarization process implementing a second density insertion to identify a hot spot and a cold spot. In some embodiments, the first density insertion includes a minimal density insertion. In other embodiments, the second density insertion includes a target density insertion.

In still other embodiments, the optimal dummy insertion includes removing dummy patterns in the cold spot, the cold spot is where a thickness deviation between a region from the first planarization process and that same region from the second planarization process is less than a minimum thickness. In other embodiments, the optimal dummy insertion includes adding dummy patterns within the hot spot, the hot spot is where a thickness deviation between neighboring regions is greater than a minimum thickness. In still other embodiments, the optimal dummy insertion includes adding dummy patterns within the hot spot, the hot spot is where a thickness deviation between a region from the first thickness report and the same region from the second thickness report is greater than a minimum thickness.

Although embodiments of the present disclosure have been described in detail, those skilled in the art should understand that they can make various changes, substitutions and alterations herein without departing from the spirit and scope of the present disclosure. For example, even though dummy metal insertion is described throughout the embodiments other types of dummy features such as silicon dioxide may be used with the present disclosure. It is understood that various different combinations of the above listed processing steps can be used in combination or in parallel. Also, features illustrated and discussed above with respect to some embodiments can be combined with features illustrated and discussed above with respect to other embodiments. Accordingly, all such modifications are intended to be included within the scope of this disclosure.

Several different advantages exist from these and other embodiments. As new process technologies emerge and circuit designs become increasingly complex, parasitic effects associated with adding unnecessary dummy patterns uniformly across the chip will become a major issue. The present disclosure provides a method for reducing the dummy metal count in a circuit design thereby saving mask making time, CPU runtime, and data storage memory. This will help achieve design timing closure quicker and easier. Furthermore, by reducing the dummy metal count, parasitic capacitance and power consumption are also reduced. The method provides optimal dummy insertion by focusing directly on metal profile/thickness instead of local metal density. This is done through virtual dummy fill in a simulation environment before proceeding to polygon extraction and manipulation which makes the runtime and storage manageable.

What is claimed is:

1. A method, comprising:
providing a circuit pattern;
generating a density report for the circuit pattern that identifies a feasible area for dummy insertion, wherein the feasible area is identified in a design rule check (DRC) environment;
simulating a planarization process with the density report to generate a thickness report for a plurality of regions and identifying a hot spot on the circuit pattern for dummy insertion, wherein the hot spot includes a region whose thickness deviates from a thickness of a neighboring region by an amount that is greater than a predefined thickness;
inserting a virtual dummy pattern in the feasible area that was identified as the hot spot and adjusting the density report accordingly, wherein the inserting the virtual dummy pattern is conducted outside the DRC environment;
simulating, after the inserting, another planarization process with the adjusted density report to determine whether the hot spot has been eliminated;
if the hot spot has not been eliminated, repeating the inserting and simulating the another planarization process; and
if the hot spot has been eliminated, fabricating a semiconductor device with a structure corresponding to a final resulting virtual dummy pattern.

2. The method of claim 1, wherein the providing includes providing the circuit pattern in a computer aided design format.

3. The method of claim 2, wherein the providing includes providing the circuit pattern in Graphical Data Stream (GDS) format.

4. The method of claim 1, wherein the providing includes configuring the circuit pattern to include a plurality of metal levels.

5. The method of claim 1, wherein the generating includes dividing the circuit pattern into the plurality of regions and determining a local density for each of the plurality of regions.

6. The method of claim 1, wherein the simulating includes running a virtual chemical mechanical polishing (VCMP) simulator.

7. The method of claim 1, wherein the predefined thickness includes a minimum thickness.

8. A method comprising:
providing a circuit layout;
generating a density report for the circuit layout to identify an area for dummy insertion;
determining an optimal dummy pattern for the circuit layout by:
simulating a first planarization process that implements a first density insertion for inserting virtual dummy patterns within the area to generate a first thickness report for the circuit layout;
simulating a second planarization process that implements a second density insertion for inserting virtual dummy patterns within the area to generate a second thickness report for the circuit layout;
comparing the first thickness report from the first planarization process with the second thickness report from the second planarization process to identify a hot spot and a cold spot, the hot spot for adding dummy patterns and the cold spot for removing dummy patterns; and
inserting a virtual dummy pattern in the hot spot and removing a virtual dummy pattern from the cold spot; and
fabricating a semiconductor device with a structure corresponding to the optimal dummy pattern.

9. The method of claim 8, wherein the generating includes dividing the circuit layout into a plurality of grids, wherein each grid has a local density associated with it.

10. The method of claim 9, wherein the generating includes running a design rule check (DRC) on the plurality of grids to identify the area and its density for dummy insertion and wherein the determining the optimal dummy insertion is conducted outside a DRC environment.

11. The method of claim 8, wherein the simulating includes running a virtual chemical mechanical polishing (VCMP) simulator.

12. The method of claim 8, wherein the simulating includes configuring the first density insertion to include a minimal density insertion.

13. The method of claim 12, wherein the simulating includes configuring the second density insertion to include a target density insertion.

14. The method of claim 8, wherein the cold spot is where a thickness deviation thickness report and that same grid from the between a grid from the first thickness report and the same grid from the second thickness report is less than a minimum thickness.

15. The method of claim 14, wherein the hot spot is where a thickness deviation between neighboring grids from the first thickness report or the second thickness report is greater than a minimum thickness.

16. The method of claim 14, wherein the hot spot is where a thickness deviation between a grid from the first thickness report and that same grid from the second thickness report is greater than a minimum thickness.

17. The method of claim 8, further comprising generating a final circuit layout with the optimal dummy insertion.

18. A semiconductor device comprising:
a circuit layout having a plurality of regions, wherein each region has a local density associated with it; and
a structure disposed within the circuit layout, the structure corresponding to an optimal dummy insertion formed by:
generating a deposit report for the circuit layout to identify a feasible area for dummy insertion;
simulating a first planarization process that implements a first density insertion for inserting virtual dummy patterns within the feasible area to generate a first thickness report for the circuit layout;
simulating a second planarization process that implements a second density insertion for inserting virtual dummy patterns within the feasible area to generate a second thickness report for the circuit layout;
comparing the first thickness report with the second thickness report to identify a hot spot and a cold spot, the hot spot for adding dummy patterns and the cold spot for removing dummy patterns; and
inserting a virtual dummy pattern in the hot spot and removing a virtual dummy pattern in the cold spot.

19. The device of claim 18, wherein the first density insertion includes a minimal density insertion.

20. The device of claim 19, wherein the second density insertion includes a target density insertion.

21. The device of claim 20, wherein the cold spot is where a thickness deviation between a region from the first thickness report and that same region from the second thickness report is less than a minimum thickness.

22. The device of claim 21, wherein the hot spot is where a thickness deviation between neighboring regions from the first thickness report or the second thickness report is greater than a minimum thickness.

23. The device of claim 21, wherein the hot spot is where a thickness deviation between a region from the first thickness report and that same region from the second thickness report is greater than a minimum thickness.

* * * * *